US00RE35376E

United States Patent [19]

Tallon et al.

[11] E Patent Number: Re. 35,376

[45] Reissued Date of Patent: Nov. 5, 1996

[54] METAL OXIDE 247 SUPERCONDUCTING MATERIALS

[75] Inventors: Jeffrey L. Tallon, York Bay; Robert G. Buckley, Northland; Donald M. Pooke, Lower Hutt, all of New Zealand

[73] Assignee: Industrial Research Limited, New Zealand

[21] Appl. No.: 365,125

[22] Filed: Dec. 28, 1994

Related U.S. Patent Documents

Reissue of:

[64] Patent No.: 5,140,000
Issued: Aug. 18, 1992
Appl. No.: 560,033
Filed: Jul. 31, 1990

[30] Foreign Application Priority Data

Aug. 2, 1989 [NZ] New Zealand ..... 230183
Nov. 14, 1989 [NZ] New Zealand ..... 231390

[51] Int. Cl.[6] ..... H01B 12/00; C04B 35/505; C04B 35/64; H01L 39/12

[52] U.S. Cl. ..... 505/125; 505/500; 505/725; 505/776; 505/779; 252/521; 423/593

[58] Field of Search ..... 505/100, 125, 505/500, 725, 776, 779, 780; 252/518, 521; 423/593

[56] References Cited

PUBLICATIONS

*Superconducting $Yb_2Ba_4Cu_7O_x$ Produced by Oxidizing Metallic Precursors,* T. Kogure et al., Physica C 156 (1988).

Dominguez et al., "Superconductive Phases . . . in the . . . Series $Y_{3-x}(BaSr)_xCu_3O_{5-y}$," *Mat. Res. Soc. Symp. Proc.* vol. 99, Nov.–Dec. 1987.

Tokiwa et al., "Crystal Structure and Superconductivity . . . in $Y_{1-x}Ca_xBa_2Cu_3O_y$ and $YBa_{2-x}La_xCu_3O_y$," *JJAP* vol. 27, No. 6, Jun. 1988.

Murphy et al., "New Superconducting Cuprate Perovskites," *Phys. Rev. Letters* vol. 58, No. 18, 4 May 1987, pp. 1888–1890.

Inoue et al, "Element Addition Effect for Superconducting Properties of $YBa_2Cu_3O_{7-y}$ Ceramics," *Nippon Ser. K.G.R.* vol. 96, No. 4, 1988, pp. 512–516.

Morris et al, "Synthesis and Properties of the 2:4:7 Superconductors . . . ," *Phys. Rev. B.* vol. 40, No. 16, Dec. 1, 1989, pp. 11406–11409.

Karpinski et al, "High Pressure Phase Diagrams (1–3000 bar Oxygen) of the (Y—Ba—Cu—O)—$O_2$ Systems," *Jrnl. Less Com. Mat.* vol. 150, 1989, pp. 207–210.

Bordet et al, "Structure Determination of the New High–Temperature Superconductor $Y_2Ba_4Cu_7O_{14+x}$," *Nature* vol. 334, 18 Aug. 1988, pp. 596–598.

Yuhuan et al, "High–Tc Superconductivity and Structure of Y—Ba—Cu Oxides . . . ," *Int. Jrnl. Mod. Phys. B* vol. 1, No. 2, 1987, pp. 253–256.

Morris et al, "Stability of 124, 123, and 247 Superconductors," *Physica C* vol. 159, No. 3, 15 Jun. 1989, pp. 287–294.

Miyatake et al, "$T_c$ Increased to 90K in $YBa_2Cu_4O_8$ by Ca Doping," *Nature* vol. 341, 7 Sep. 1989, pp. 41–42.

Karpinski et al, "The Nonstoichiometry of the High–Tc Superconductor $Y_2Ba_4Cu_7O_{15\pm x}$ . . . ," *Physica C* vol. 161, Nos. 5 & 6, 15 Dec. 1989, pp. 615–625.

A. Otto et al., "Superconducting Properties and Formation of $Yb_2Ba_4Cu_7O_{14-x}$", Physica C 160 (1989) 352 360.

*Primary Examiner*—Paul Lieberman
*Assistant Examiner*—M. Kopec
*Attorney, Agent, or Firm*—Dann, Dorfman, Herrell and Skillman, P.C.

[57] ABSTRACT

The present invention comprises novel oxide materials exhibiting bulk superconductivity up to and exceeding 85K and processes for their synthesis. The oxides are within the formula $R_aBa_bCu_cO_d$ wherein $1.9<a<2.1$, $3.9<b<4.1$, $6.8<c<7.2$, $14.4<d<15.2$ and wherein R is Y or any of the lanthanide rare earth elements. Certain substitutions such as Ca and La on the R and Ba sites are included.

29 Claims, 8 Drawing Sheets

METAL OXIDE 247 SUPERCONDUCTING MATERIALS

Matter enclosed in heavy brackets [ ] appears in the original patent but forms no part of this reissue specification; matter printed in italics indicates the additions made by reissue.

*This application is a Reissue of Ser. No. 07/560,033 (filed Jul. 30, 1991, now U.S. Pat. No. 5,140,000).*

The present invention comprises novel oxide materials exhibiting bulk superconductivity up to 85K and certain of which exhibit superconductivity at temperatures exceeding 85K, and processes for their synthesis.

The oxide compounds $RBa_2Cu_3O_{7-\delta}$ (hereinafter referred to as 1-2-3) and $RBa_2Cu_4O_{8-\delta}$ (hereinafter referred to as 1-2-4) are known to be superconductors with superconducting transition temperatures $T_c$, respectively, of 90–93K (when $\delta<0.15$) and of about 79–81K. For 1-2-3, $\delta$ may range from 0 to 1.0 while for 1-2-4, $\delta$ cannot be varied much at all and lies close to zero. The structure of 1-2-3 is equivalent to a tripled defect perovskite cell with consecutive layers in the unit cell of: R in a B-site with vacant oxygen sites in the layer, a buckled square planar $CuO_2$ layer with Cu in the corner-shared A-sites, a BaO layer with Ba in the B-site, a square-planar $CuO_{1-\delta}$ layer with Cu in the corner-shared A-sites, then the structure repeated in reverse order by a reflection about the $CuO_{1-\delta}$ layer. This layer can load or unload oxygen, as described by the value of $\delta$, depending on the temperature of annealing conditions and the ambient oxygen partial pressure. These materials are typically prepared by solid state reaction at high temperature of precursor materials, such as $Y_2O_3$, $BaCO_3$, and CuO followed by annealing at lower temperatures, about 400° C. in an ambient oxygen containing atmosphere. When fully loaded ($\delta=0$), $T_c$ is a maximum around 92K when R is Y or any of the lanthanide rare-earth elements. In this state the oxygens in the $CuO_{1-\delta}$ layer are ordered onto one set of sublattice sites forming -Cu-O-Cu-O- chains, the otherwise crystallographically equivalent sites being vacant. This ordering renders the material orthorhombic in symmetry. If the anneal temperature is raised above 400° C. these oxygens commence to unload from the material ($\delta>0$) and begin to disorder onto the otherwise vacant sites until, at a critical temperature $T_{OT}$, where both sites finally have equal random occupancy, the material undergoes a second-order transition from orthorhombic to tetragonal symmetry.

This transition presents problems in synthesizing and processing the materials for optimum performance. Typically 1-2-3 is oxygen loaded after synthesis to maximise the superconducting transition temperature by slow cooling or annealing in an oxygen containing atmosphere to temperatures below 450° C. As the material cools through the transition temperature $T_{OT}$ the thermal expansion becomes large and highly anisotropic resulting in extensive microcracking. This reduces the maximum current-carrying capacity (the so-called critical current) as well as reducing the mechanical strength. The oxygen diffusion coefficient is also so low that oxygen loading occurs prohibitively slowly in dense material (<2% porosity).

The structure of 1-2-4 is the same as fully oxygen-loaded 1-2-3 ($\delta=0$) with a double layer of CuO chains displaced 0.5b in the b-direction relative to each other. Because of the stability of the double chain-layer the oxygen stoichiometry remains nearly constant with $\delta$ nearly zero independent of oxygen partial pressure and temperature. This material therefore does not present the same problem of the need to load oxygen in order to prepare superconducting material and its associated problems of a high thermal expansion coefficient and accompanying micro-cracking. Unfortunately the transition temperature is too low to be of practical use at the temperature of liquid nitrogen (77K) due to the deficient electron hole carrier concentration on the $CuO_2$ planes.

Intergrowths of 1-2-4 can occur in 1-2-3, and vice versa, and an ordered phase is known to exist having chemical formula $R_2Ba_4Cu_7O_{15-\delta}$ (referred to hereinafter as 2-4-7) which comprises alternating unit cells of 1-2-3 and 1-2-4 (Nature 334, 596 (1988). This reported compound had a low transition temperature $T_c$ of 45 to 50K, and subsequent efforts by the authors failed to improve much on this.

It is an object of the present invention to provide novel materials exhibiting superconductivity. Certain 2-4-7 materials of the invention have a superconducting transition temperature of 92K and certain other desirable properties including reduced oxygen loading requirements, a reduced thermal expansion coefficient and a reduced tendency to microcrack during synthesis and processing.

It is a further object of the invention to enable preparation of 2-4-7 materials substantially free from extended 1-2-3 or 1-2-4 intergrowth defects.

The invention also provides processes for the preparation of the 2-4-7 materials including processes which enable their preparation in oxygen at ambient atmospheric pressure.

These, and other aspects, features and advantages of the invention, will become more apparent in the detailed description with reference to drawings and examples which follows.

In broad terms the invention may be said to comprise oxide materials which exhibit bulk superconductivity within the formula $$R_aBa_bCu_cO_d$$

wherein:

$$1.9<a<2.1,$$

$$3.9<b<4.1,$$

$$6.8<c\leqq 7.2,$$

$$14.4<d<15.2$$

R is L where L is Y, La, Nd, Sm, Eu, Gd, Dy, Ho, Er, Tm or Yb, or any combination thereof, Ba is Ba or Ba partially substituted by either or both of Sr and La, Cu is Cu or Cu partially substituted by Li Ag, Au, Hg, Tl, Bi, Pb, Sb or Ga or any Periodic Table transition metal element or Group 3a, 4a, or 5a metal, or any combination thereof, and O is O or O partially substituted by any of N, P, S, Se or F or any combination thereof.

The invention also encompasses such oxide materials wherein one or both of L and Ba are partially substituted by any of the elements A given by Ca, Li, Na, K, Cs or Rb, or any combination thereof. Such materials wherein A is Ca may be prepared to exhibit superconductivity at a Tc of 85K or higher and exhibit enhanced oxygen mobility allowing oxygen loading in a time shorter than for the equivalent unsubstituted 2-4-7 material.

Preferred materials have the formula $$L_{2-p}Ba_{4-q}A'_{p+q}Cu_7O_{15-\delta}$$

wherein:

$$0 \leqq p+q<1,$$

$$-0.2>\delta>0.6,$$

L, Ba, A, Cu and O are as defined above and A' is La alone or La in combination with any other element of A.

Preferred materials of the invention have the formula $L_2Ba_4Cu_7O_{15-\delta}$, where preferably $\delta>0.1$ and preferably about O and L is preferably Y, Nd, Sm, Eu, Gd, Dy, Ho, Er or Tm or any combination thereof and most preferably Y or Er.

Particularly preferred alkali substituted materials of the invention have the formula $$L_{2-ax}Ba_{4-(1-a)x}Ca_xCu_7O_{15-\delta}$$

wherein:
a is 0.75,
x is 0.025, 0.05, 0.1 or 0.2, and
L is either Y or Er.

Such materials include those having the formula $L_{2-p}Ca_pBa_{4-q}La_qCu_7O_{15-\delta}$, including those wherein L is Y, Nd, Sm, Eu, Gd, Dy, Ho, Er or Tm.

Further preferred materials are those having the formula $L_2Ba_{4-q}La_qCu_7O_{15-\delta}$, of which a particularly preferred example is $Y_2Ba_{3.8}La_{0.2}Cu_7O_{15-\delta}$.

The invention also comprises a process for preparing the oxide materials comprising reacting precursor materials for between 1 and 300 hours at a temperature T (in units of °C.) and oxygen partial pressure $Po_2$ (in units of Pa) satisfying the equation [$1210-180L+21L^2<T<2320-581.5L+58.5L^2$] *$1210-180L+21L^2<T<2320-581.5L+58.5L^2$* where $$L=\log_{10}Po_2$$

and preferably wherein $Po_2 \leqq 10^6$ Pa, and most preferably wherein $Po_2$ is substantially $10^5$ Pa and 845° C.$\leqq T \leqq$870° C.

Materials of the general formula of the invention where R is Y, Ba is the element Ba, Cu is the element Cu and O is the element 0, and which have been oxygen loaded to the point where $\delta$ is reduced to approximately zero, exhibit superconductivity exceeding 90K.

Of the [1-2-3-] *1-2-3* and 1-2-4 units *in* 2-4-7 only the 1-2-3 units will load or unload oxygen. As a consequence the oxygen variability for 2-4-7 is halved relative to 1-2-3 and potential for cracking is therefore diminished. Moreover, 2-4-7 remains orthorhombic over its entire oxygen composition range, thus avoiding the above mentioned problems of the orthorhombic-to-tetragonal transition which occurs in 1-2-3. The thermal expansion coefficient is therefore not strongly anomalous nor highly anisotropic and the propensity for cracking is greatly diminished. In general, ordering defects will occur resulting in additional intergrowths of either 1-2-3 or 1-2-4, or both in 2-4-7 so that the Cu stoichiometry in the chemical formula will not usually be exactly 7.

In the accompanying drawings that are referred to in the examples:

FIG. 1 shows the phase diagram for the Y-Ba-Cu-O system showing the stability regions for 1-2-3 and 2-4-7 (shaded region) as a function of oxygen partial pressure $Po_2$ and temperature. The dashed line shows the O-T transition in metastable 1-2-3 and the oblique sloping lines show contours of constant composition in metastable 1-2-3 with values of $\delta$ shown.

Figure 7:
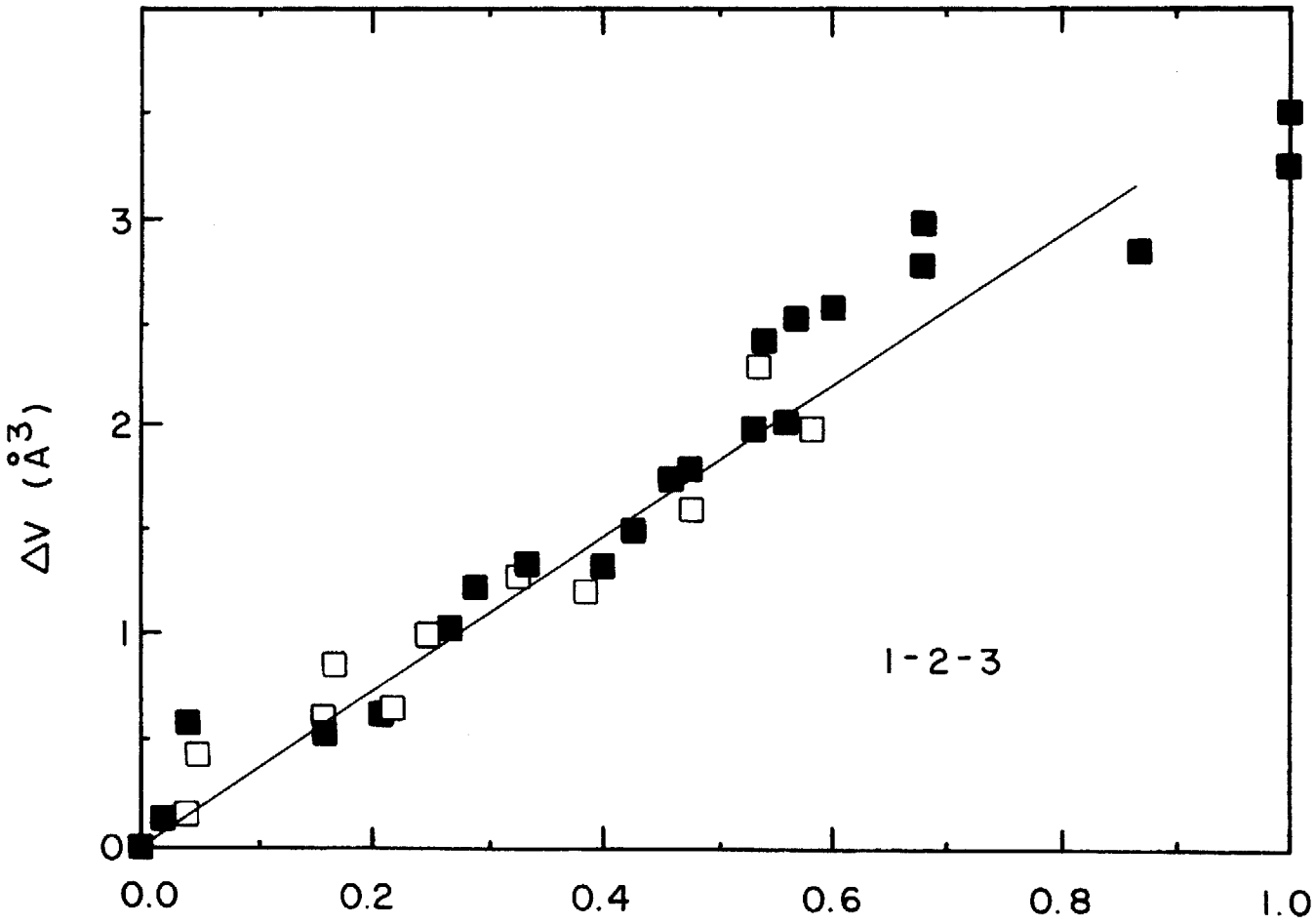

FIG. 7 shows the change in molar volume as a function of $\delta$ for 1-2-3 per $Y_2Ba_4Cu_6O_{14-\delta}$ formula unit. Open symbols: dilation on quenching; solid symbols; X-ray and neutron powder diffraction data from Physical Review B39, 2784(1989).

FIG. 8 [shows] *show* $CoK_\alpha$ X-ray diffraction (XRD) patterns for yttrium 1-2-3(a), 2-4-7(b), and 1-2-4(c).

The materials of the invention may be prepared as a thin film using known techniques, or as a bulk materials (including thick films). The materials of the invention may be prepared by solid state reaction and sintering of the appropriate precursor materials by techniques known in the art for preparation of 1-2-3, but with additional reference to the choice of oxygen partial pressures and temperatures for carrying out the reaction as are further described. Preparation of 1-2-3 is described in D W Murphy et al, Science 241, 922 (1988) for example. Alternatively the precursor materials may be stoichiometrically mixed as nitrates in aqueous or other suitable solution and sprayed as a mist which is passed through an oven, furnace, microwave heating zone or the like for rapid reaction of the discrete droplets. The reacted droplets or particles may then be collected by way of a cyclone, filter, electrostatic precipitator, or the like. The fine reacted particles thus produced may be sintered into a body of arbitrary shape by heating at temperatures and oxygen partial pressures within the 2-4-7 stability region further described below.

The substituted 2-4-7 materials of the invention may be prepared when the reaction and sintering are carried out at a temperature T and oxygen partial pressure $Po_2$ which satisfy the equation $$1220-180L+21L^2<T<2320-581.5L+58.5L^2$$

where $L=\log_{10}Po_2$.

Figure 1:
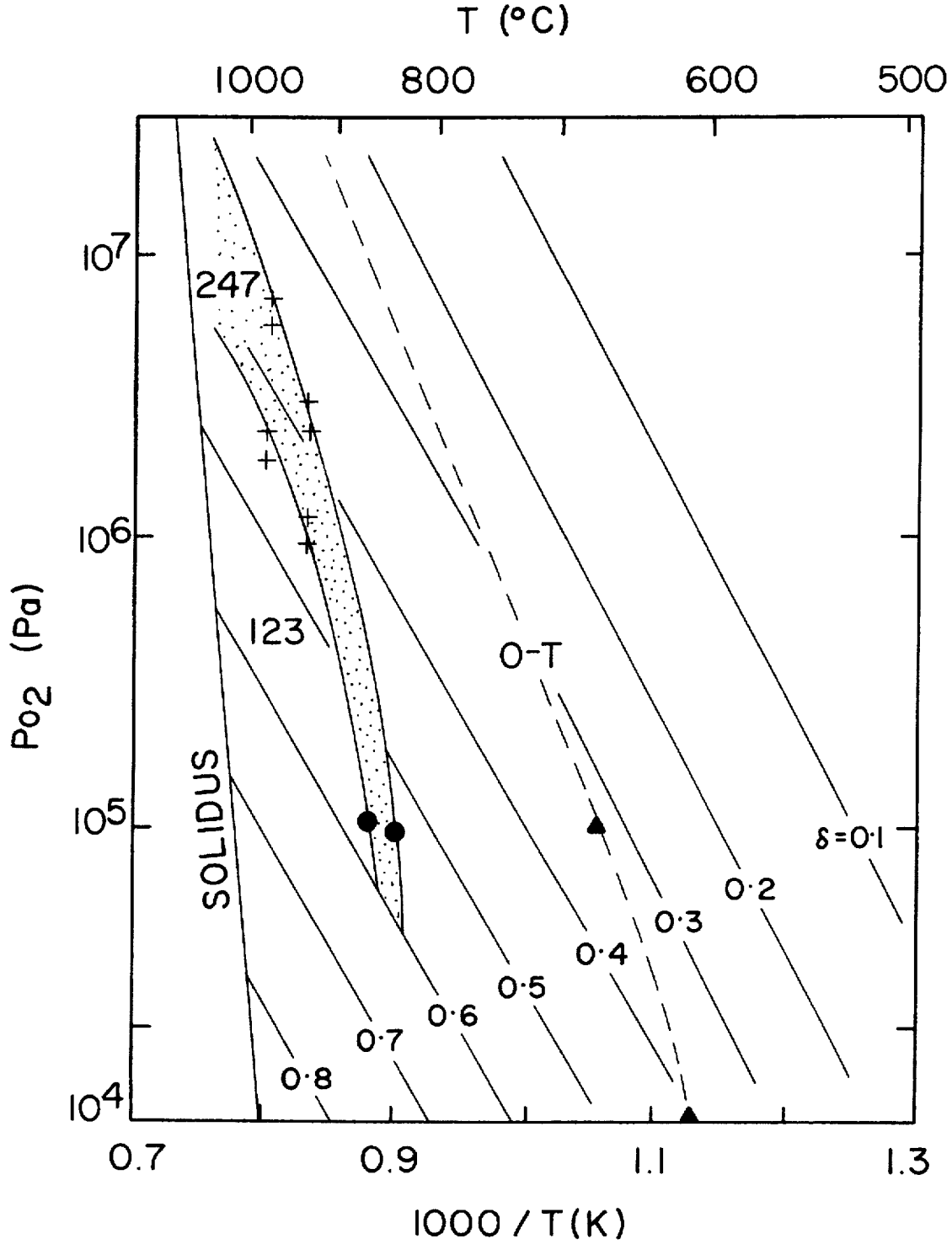

Referring to FIG. 1, this formula defines the shaded region marked '247' which defines the 2-4-7 stability boundary with respect to other phases. By reacting and sintering within this band, material with composition close to 2-4-7 may be prepared and, by extended annealing, defect intergrowths of 1-2-3 and 1-2-4 may be minimised. As is known in the art, at intermediate steps the material should preferably be ground and milled and optionally recompressed to increase the homogeneity before subjecting to further reaction and sintering within the stability band. For example, $Y_2Ba_4Cu_7O_{15-\delta}$ may be prepared in 1 bar of flowing oxygen between temperature of 845° C. and 870° C. though, in general, the exact location of these boundaries will depend upon the composition and degree of elemental substitution. Another novel preparation technique is to react, sinter or otherwise thermally process at the solidus melt boundary of the 2-4-7 stability band in order to achieve grain growth, grain orientation and densification, a process described as melt texturing. A further alternative is that prior to the last sintering step, the grains of the powdered 2-4-7 may be crystallographically aligned in a strong magnetic field according to the known art and then sintered to produce a preferentially oriented ceramic.

Material prepared at the lower temperature/lower pressure end of the stability band may be porous and not ideally sintered. Porosity may be reduced by using solgel, coprecipitation, spray drying of aqueous precursor solution, spray pyrolysis or other methods as are known in the art of ceramics synthesis. The material may also be densified by raising the temperature outside of the stability band for short duration. The initial sintering rate is faster than the decomposition rate and densification occurs. The material should typically, for example, be further annealed within the stability band subsequent to densification and several densification cycles could, for example, be employed. For advanced densification either the temperature or duration of sinter will need to be so large that 2-4-7 will begin to decompose to 1-2-3+copper oxide but, on further extended annealing within the stability band, 2-4-7 will regrow especially if the precipitates of copper oxides are controlled to be finely dispersed. Oxygen partial pressure may be controlled by gas pressure, or alternatively, across the entire stability band shown in FIG. 1, by the use of electrochemical means to control the oxygen activity in the 2-4-7, for example, by placing an oxygen-ion electrolyte conductor such as Y-stabilised $ZrO_2$ in contact with the material and maintaining an appropriate voltage across the cell thus formed according to the known methods of solid-state electrolytic cells.

The reaction rate may be enhanced by the use of certain alkali metal fluxes, catalysts or reaction rate enhancers which may operate by providing a molten or vapour phase flux or by temporary or permanent substitution into the lattice of the reactants or of the final product. Such fluxes or catalysts etc for the preparation of 2-4-7 include: the oxides, carbonates, halides and hydroxides of the alkali metals. Preferred examples of catalysts are the oxides of Na and K which may be introduced to the precursor materials as $NaNO_3$ or $KNO_3$ which will decompose to the oxides. The attractive feature of these catalysts is that they are volatile and will, with time, evaporate off leaving phase-pure 2-4-7 material. Further catalyst may be added as required at intermediate grinding and milling steps. The alkali catalysts appear to operate, at least in part, by temporary or permanent substitution into the 2-4-7 lattice, predominantly in the Ba-site and also in the R-site. The use of alkali carbonates as catalysts has been described in relation to the synthesis of $YBa_2Cu_4O_8$ (Nature 338, 328 1989)). The catalyst remained in the solid state during reaction and required to be removed by dissolving out in water at the completion of synthesis leaving powdered 1-2-4 material only. In the method of the present invention small amounts only of alkali catalyst are employed, preferably the oxides of Na or K which evaporate away during synthesis leaving sintered ceramic product. The mole fraction, $\alpha$ of introduced catalyst is preferably in the range $0<\alpha\leqq 1.0$ and most preferably $0.1\leqq\alpha\leqq 0.3$. The synthesis of ceramic product, as opposed to powder, is a major advantage of this technique. Another method for enhancing the reaction rate is to substitute Ca into the lattice using known methods of chemical preparation techniques. As for 1-2-3, Ca will substitute into 2-4-7 predominantly in the R-site but also in the Ba-site, the substituted material exhibiting enhanced atomic diffusion rates.

Preferred examples of 2-4-7 oxide materials include $L_2Ba_4Cu_7O_{15-\delta}$, $L_2Ba_4Cu_7O_{15}$, $L_{2-p}Ba_{4-q}Ca_{p+q}Cu_7O_{15-\delta}$ where $0\leqq p+q\leqq 0.6$, $L_{2-p}Ba_{4-q}Na_{p+q}Cu_7O_{15-\delta}$, $L_{2-p}Ba_{4-q}K_{p+q}Cu_7O_{15-\delta}$, $L_2Ba_{4-q}La_qCu_7O_{15-\delta}$ and $L_{2-p}Ca_pBa_{4-q}La_qCu_7O_{15-\delta}$. Moreover as $T_c$ in $Y_2Ba_4Cu_7O_{15-\delta}$ increases monotonically towards 92K if $\delta$ is decreased towards 0 it is clear that $T_c$ may be increased above 92K if $\delta$ is reduced below zero by excess oxygen loading or if the hole concentration is otherwise increased. Examples of such novel materials are $L_2Ba_4Cu_7O_{15-\delta}$ with $-0.2<\delta<0.0$ prepared, for example, by slow cooling at oxygen pressures in excess of $10^5$Pa or by the use of electrochemical techniques as described above. A preferred example is when L=Nd. This large ion increases the a and b lattice parameters thus reducing oxygen-oxygen repulsion and allowing the insertion of extra oxygen;

$L_{2-p}A_pBa_{4-q}A_qCu_7O_{15-\delta}$ as described above;

$L_2Ba_4Cu_{7-w}T_wO_{15-\delta}$ where T is any of, or combination of Li, Ag, Au, Hg, or Tl in their monovalent states and preferably substituted on the copper chain-sites.

The materials of the invention and their preparation are further illustrated by the following examples.

EXAMPLE 1

Figure 2:
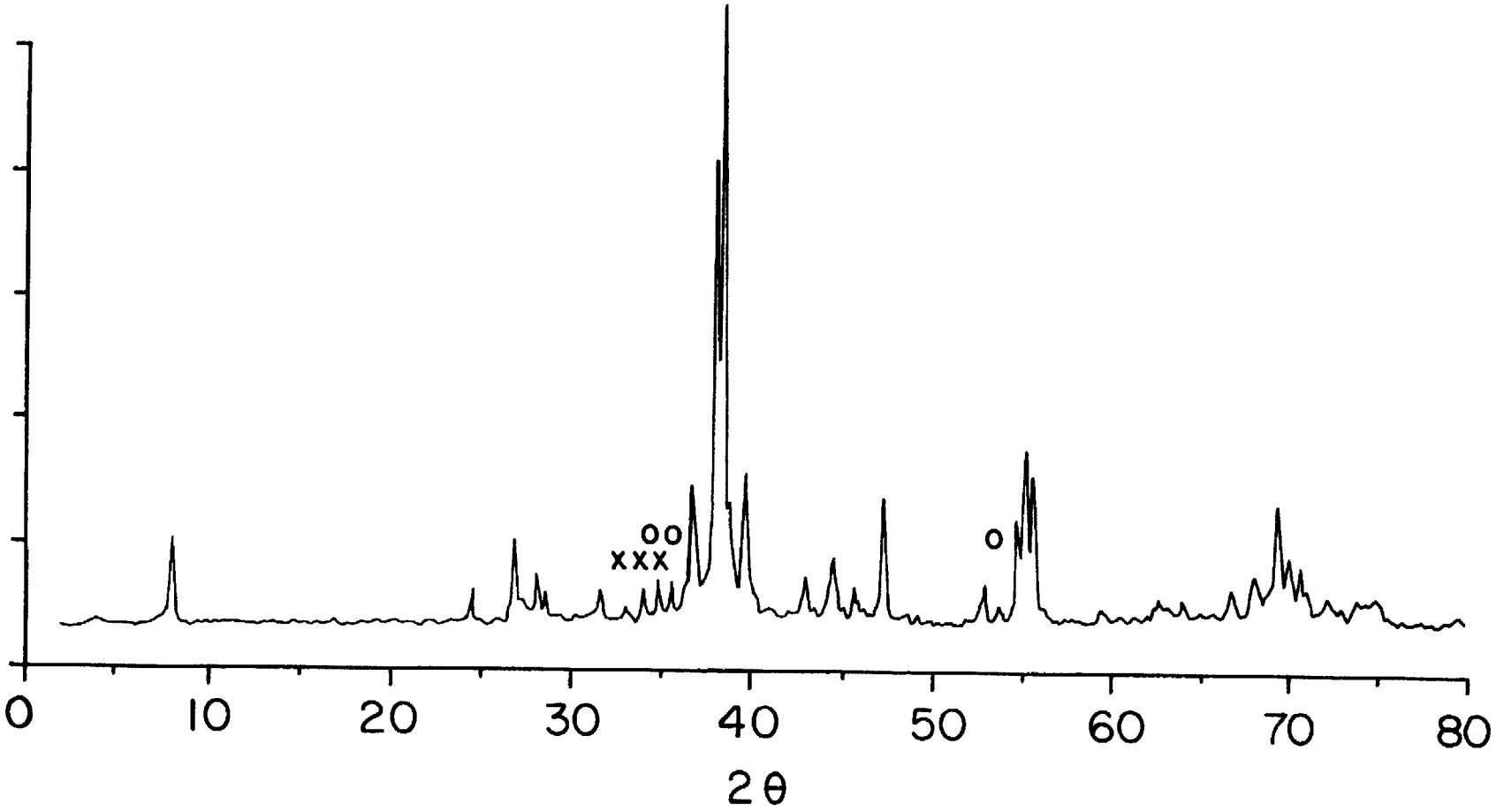
FIG. 2 shows an X-ray diffraction pattern using Co $K_\alpha$ radiation for $Y_2Ba_4Cu_7O_{15-\delta}$. Impurity lines are marked X for $BaCuO_2$ and O for $Y_2BaCuO_5$.
Figure 3:
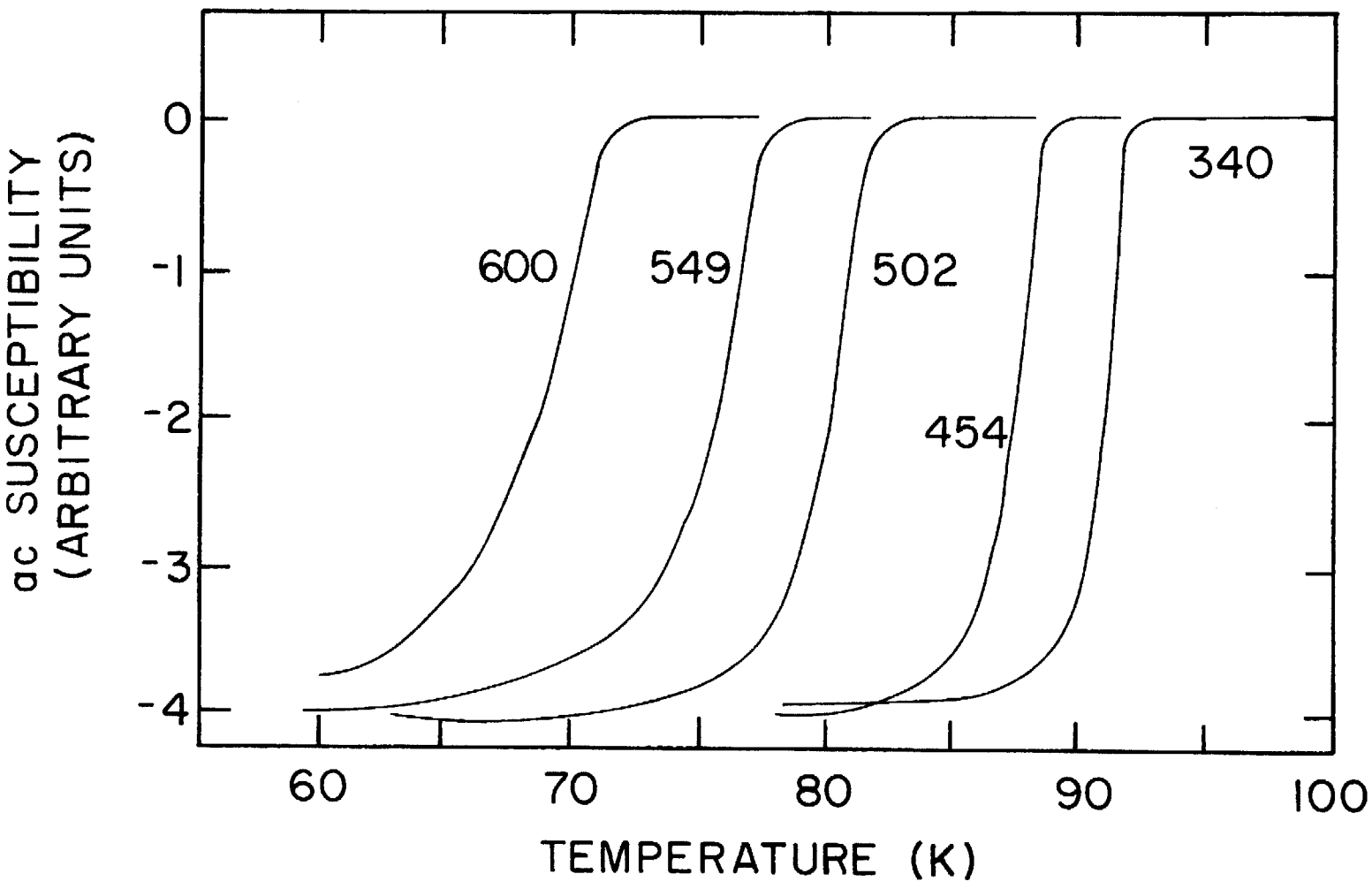
FIG. 3 shows the temperature dependence of the AC susceptibility for $Y_2Ba_4Cu_7O_{15-\delta}$ annealed in oxygen at various temperatures shown, then quenched into liquid nitrogen.
Figure 4:
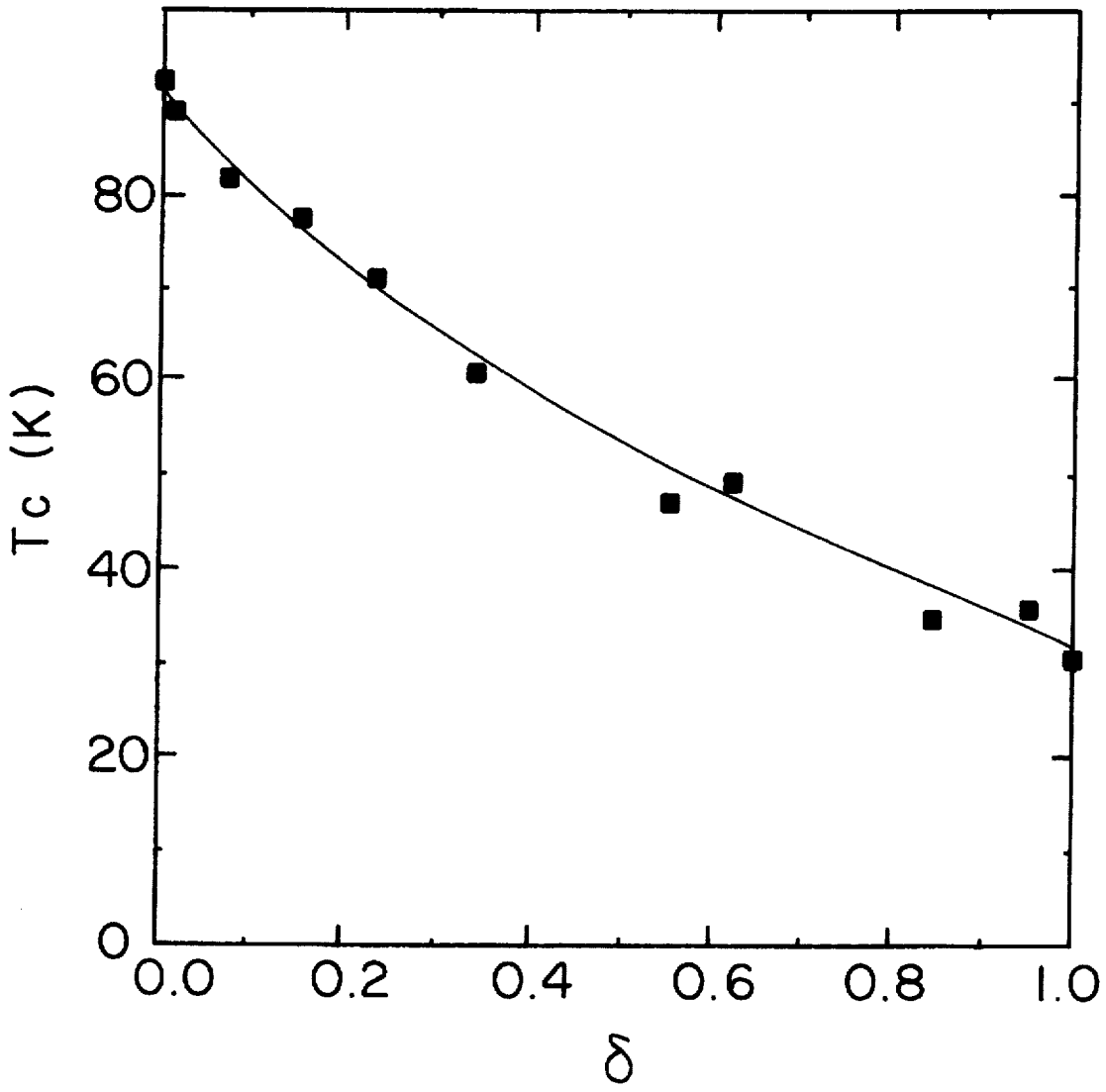
FIG. 4 shows the onset temperature $T_c$ for the diamagnetic onset, obtained from measurements such as shown in FIG. 3, as a function of $\delta$.
Figure 5:
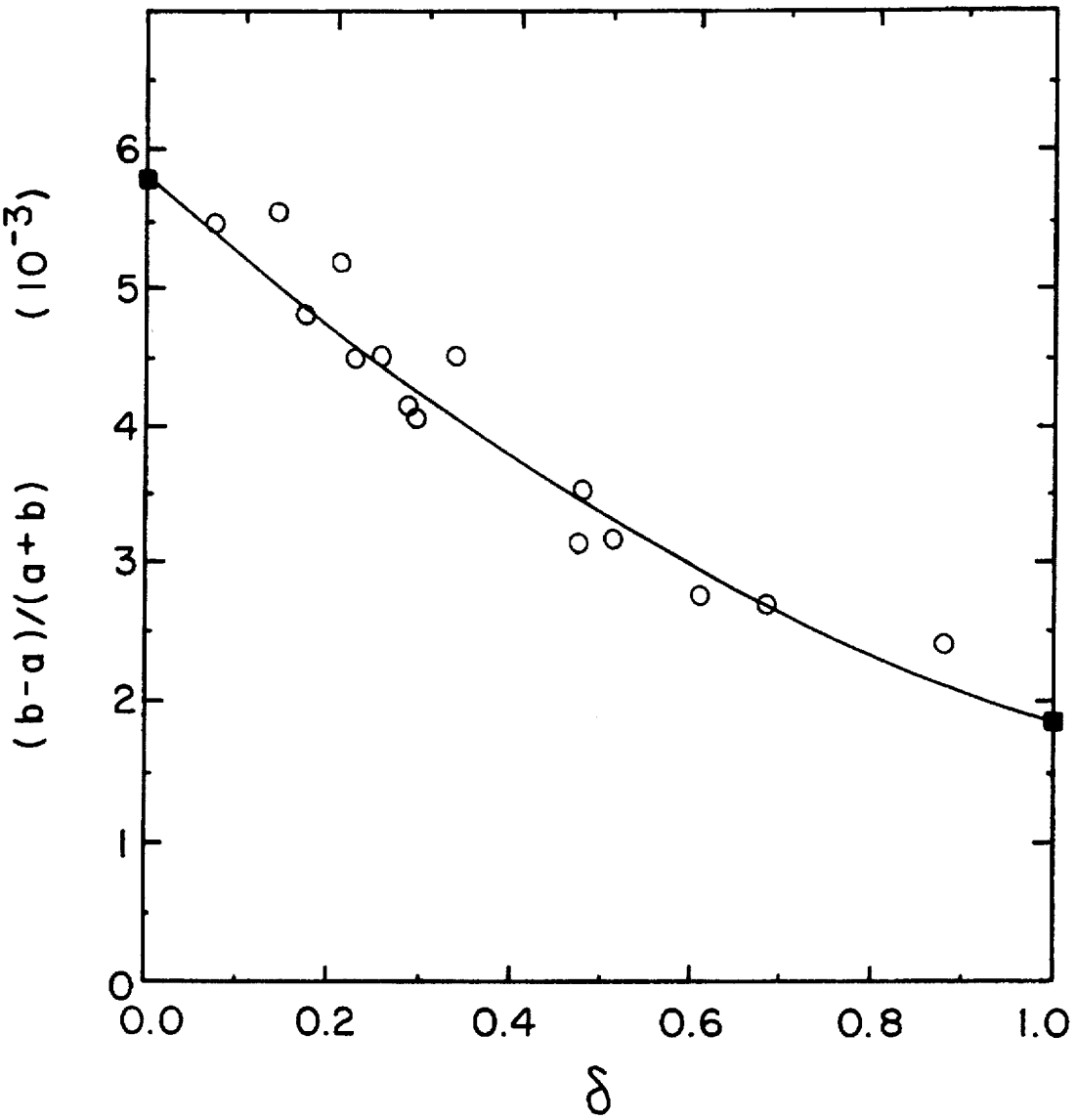
FIG. 5 shows the orthorhombic distortion in quenched samples of $Y_2Ba_4Cu_7O_{15-\delta}$ as a function of $\delta$.
Figure 6:
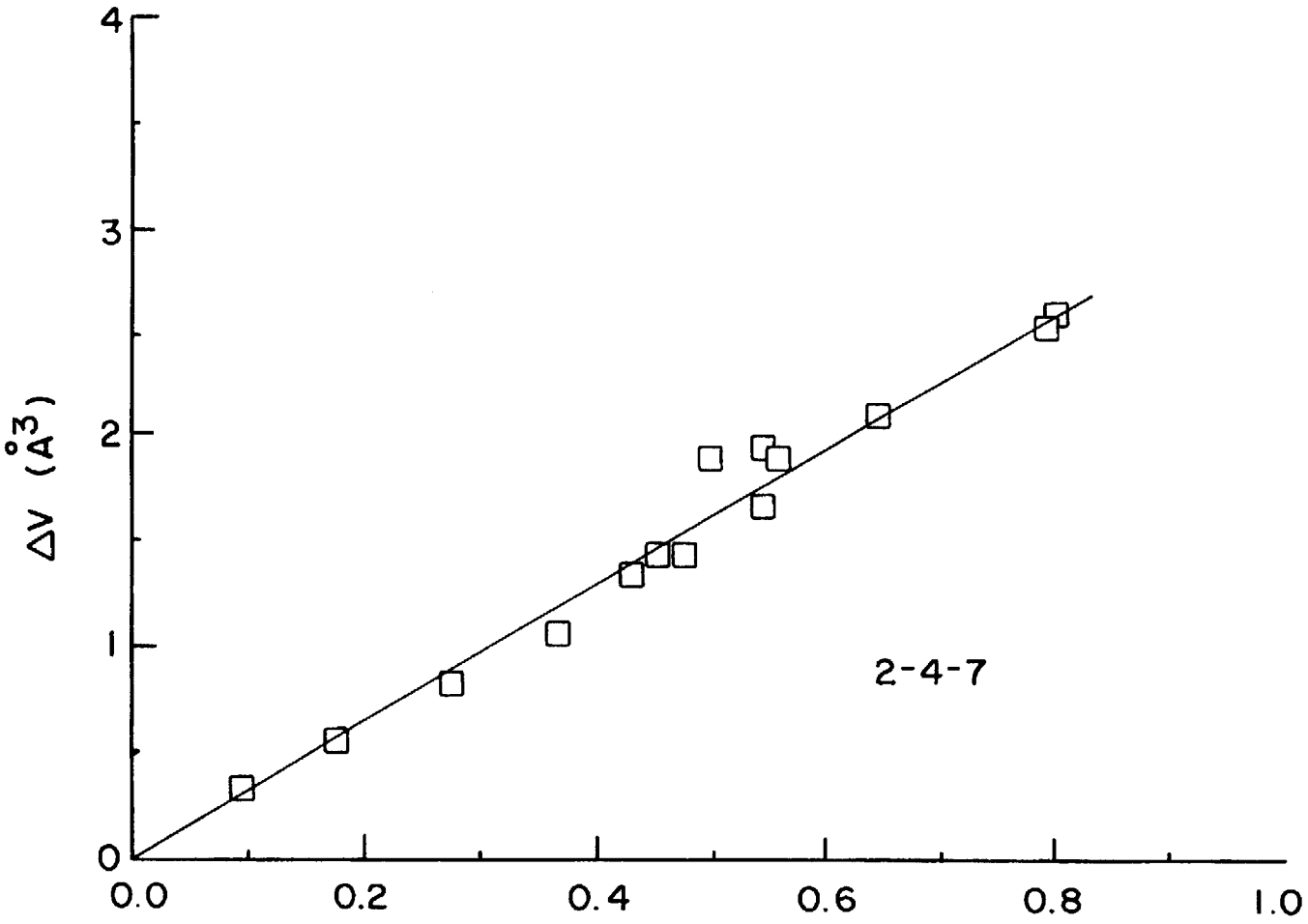
FIG. 6 shows the change in molar volume per formula unit for quenched samples of $Y_2Ba_4Cu_7O_{15-\delta}$ as a function of $\delta$.

Samples of $Y_2Ba_4Cu_7O_{15-\delta}$ were prepared by reaction between temperatures of 840° C. and 870° C. of stoichiometric quantities of $Y_2O_3$, $Ba(NO_3)_2$ and submicron sized CuO in flowing oxygen at 1 bar. The phase diagram shown in FIG. 1 shows the region of stability of 2-4-7 thus determined. This together with data reported at high pressures between 20 and 100 bar (Physica C159, (1989) 287) allows the construction of the boundaries of stability of 2-4-7. Samples prepared within the boundaries indicated will progress to the required single-phase products given sufficient reaction time. The precursor materials were mixed with 0.2 gram formula units of $KNO_3$ or $NaNO_3$ and decomposed at 750° C. for 1 hour. The residue was pressed into pellets and reacted as above. At 12, 24 and 36 hours the pellets were rapidly withdrawn from the furnace, ground and milled and re-pressed into pellets for further reaction, then left for a further 3 to 5 days sintering under the same reaction conditions. The result was nearly single-phase material as indicated by the X-ray diffraction patterns shown in FIG. 2. In order to control the oxygen content samples were annealed at a fixed oxygen partial pressure and a given temperature then rapidly quenched by dropping into liquid nitrogen. FIG. 3 shows AC magnetic susceptibility measurements on a sample annealed in oxygen at the different temperatures shown. Weight changes in these samples were measured and it was found that a sample fully oxygen loaded at 350° C. then subjected to an anneal in argon at 550° C. experienced a mass change corresponding to a change in $\delta$ of 0.99. This gave an absolute scale to determine $\delta$. FIG. 4 shows the onset temperature, $T_c$ for diamagnetic susceptibility plotted against $\delta$, illustrating $T_c$ rising monotonically with $\delta$, in contrast to the known behaviour for 1-2-3 which exhibits plateaux. X-ray diffraction measurements were performed on quenched samples and FIG. 5 shows the orthorhombic distortion (b−a)/(b+a) as a function of $\delta$. Orthorhombicity is never lost even when fully loaded. FIG. 6 shows the change in molar volume for $Y_2Ba_4Cu_7O_{15-\delta}$ as a function of $\delta$ determined from the reversible changes in length of the quenched samples. The change in volume per formula unit is $3.1A^3$ per oxygen vacancy. The increase in volume with $\delta$ exactly matches that for 1-2-3 shown in FIG.

7. For 1-2-3 the volume change per formula unit $Y_2Ba_4Cu_6O_{14-\delta}$ is $3.6A^3$ per oxygen vacancy. As only half as much oxygen loads into 2-4-7 as 1-2-3, the additional anomalous thermal expansion due to oxygen loading will be half that of 1-2-3. The absence of a tetragonal to orthorhombic transition means that the thermal expansion coefficient is free of the highly anisotropic behaviour observed in 1-2-3 just below the transition which is a major driving force for microcracking in 1-2-3. Microcracking is therefore greatly reduced in 2-4-7.

Figure 8A:
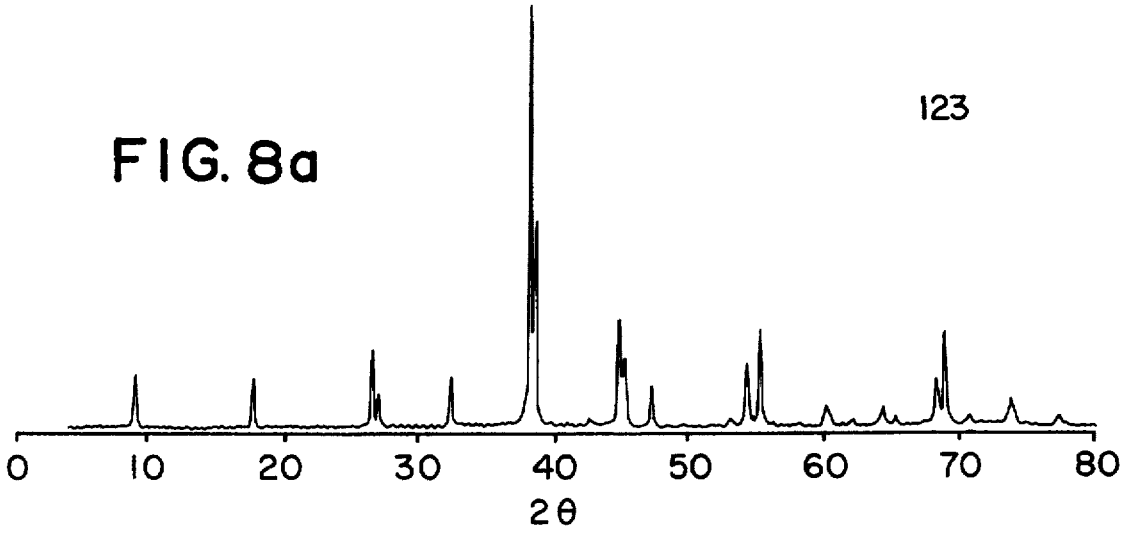
Figure 8B:
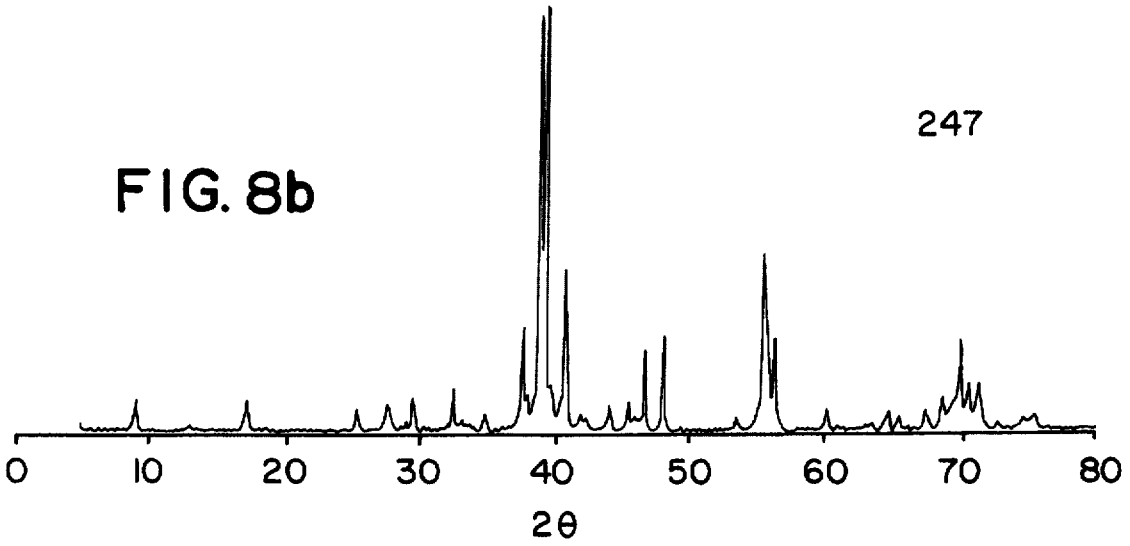
Figure 8C:
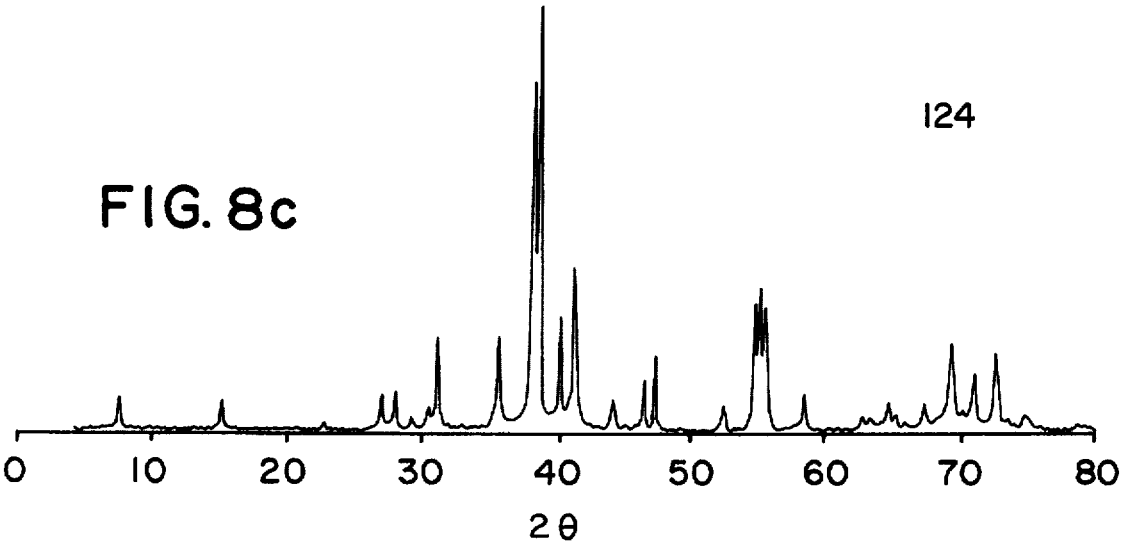

Single phase material lacking in any impurity phases evident from X-ray diffraction was prepared by these methods. [FIG. 8 shows] *FIGS. 8a to 8c show* XRD patterns $Y_2Ba_4Cu_7O_{15}$ compared with that for the 1-2-3 and 1-2-4 compounds.

EXAMPLES 2 TO 10

These samples were prepared as described in Example 1 using 0.2 mole fraction of $NaNO_3$ as the reaction rate enhancer and reacted in flowing oxygen at one atmosphere at temperatures between 860° and 870° C. Calcium and lanthanum were introduced as their nitrates and reaction time was between 3 and 5 days with 3 or more intermediate grinding/milling steps. The results are summarised under Table 1. The superconducting transition temperature $T_c$ is reported as the highest temperature for zero electrical resistivity, which usually coincided with the onset of diamagnetic susceptibility, and the c-axis lattice parameter is also tabulated. All samples were slow-cooled in oxygen to 350° C. and held there overnight. The degree of oxygen loading arising from this annealing does not necessarily correspond to that required for maximum $T_c$ values.

TABLE I

| Ex. | Composition (atomic ratio) | | | | | | Tc (K) | |
|---|---|---|---|---|---|---|---|---|
| No. | Y | Er | Ca | Ba | La | Cu | (R = 0) | c (Å) |
| 2 | 2 | | | 4 | | 7 | 93 | 50.603 |
| 3 | | 2 | | 4 | | 7 | 92 | |
| 4 | | 1.925 | .1 | 3.975 | | 7 | 91 | |
| 5 | | 1.85 | .2 | 3.95 | | 7 | 91 | |
| 6 | 1.981 | | [.25] .025 | 3.994 | | 7 | 88.3 | |
| 7 | 1.962 | | .05 | 3.988 | | 7 | 91 | 50.613 |
| 8 | 1.925 | | .1 | 3.975 | | 7 | 91 | 50.608 |
| 9 | 1.85 | | .2 | 3.95 | | 7 | 88 | 50.621 |
| 10 | 2 | | | 3.8 | 0.2 | 7 | 76 | 50.524 |

The foregoing describes the invention including preferred forms and examples thereof. The preparation of derivative materials for forms other than sintered ceramic form, i.e. thin films, thick films, single crystals, filaments and powders other than those specifically exemplified will be within the scope of those skilled in the art in view of the foregoing. The scope of the invention is defined in the following claims.

We claim:

1. Oxide materials which exhibit bulk superconductivity at [temperatures exceeding 85K] , *temperature of at least 88K*, within the formula $$R_aB_bCu_cO_{15\delta}$$

wherein:

$$1.9<a<2.1,$$

$$3.9<b<4.1,$$

$$6.8<c\leqq 7.2,$$

$$[-0.2<\delta<0.6]\ -0.2<\delta<0.1,$$

R is Y, La, Nd, Sm, Eu, Gd, Dy, Ho, Er, Tm or Yb, or any combination thereof, and B is Ba or Ba plus a minor amount of Sr or La or a combination thereof.

2. The material of claim 1, wherein a=2, b=4, c=7 and having the formula $$[R_2R_4Cu_7O_{15-\delta}$$

and wherein $-0.2<\delta<0.6]$ $R_2B_4Cu_7O_{15-\delta}$.

3. The material of claim 2, wherein $[-0.2<\delta<0.1]$ $-0.2<\delta<0.0$.

4. The material of claim 2, wherein δ is about 0 and R is Y, Nd, Sm, Eu, Gd, Dy, Ho, Er or Tm or any combination thereof.

5. The material of claim 2 wherein R consists essentially of Y or Er.

6. Oxide materials which exhibit bulk superconductivity at temperatures exceeding 85K, within the formula $$R_{a-p}B_{b-q}A_{p+q}Cu_cO_{15-\delta}$$

wherein:

$$1.9<a<2.1,$$

$$3.9<b<4.1,$$

$$6.8<c\leqq 7.2,$$

$$[0<p+q<1]\ 0<p+q<1,\ p>0$$

$$-0.2<\delta 0.6,$$

R is Y, La, Nd, Sm, Eu, Gd, Dy, Ho, Er, Tm or Yb, or any combination thereof,

B is Ba or Ba plus a minor amount of Sr or La or a combination thereof, and

A is Ca, Li, Na, K, Cs or Rb or any combination thereof, or La or La in combination with any of Ca, Li Na, K, Cs and Rb.

7. The material of claim 6, wherein A is Ca.

8. Oxide materials which exhibit bulk superconductivity at temperatures exceeding 85K within the formula $$R_{2-ax}B_{4-(1-a)x}Ca_xCu_7O_{15-\delta}$$

wherein:

a is 0.75, x is 0.025, 0.05, 0.1 or 0.2, $-0.2<\delta<0.6$,

R consists essentially of Y or Er, and

B is Ba or Ba plus a minor amount of Sr or La or a combination thereof.

9. Oxide materials which exhibit bulk superconductivity at temperatures exceeding 85K within the formula $$R_{2-p}Ca_pB_{4-q}La_qCu_7O_{15-\delta}$$

wherein:

$-0.2<\delta<0.6$,

[$0\leqq p+q<1$] *$0<p+q<1$, $g>0$,*

R is Y, La, Nd, Sm, Eu, Gd, Dy, Er, Tm, or Yb, or any combination thereof, and

B is Ba or Ba plus a minor amount of Sr.

10. The materials of claim 9 wherein R is Y, Nd, Sm, Eu, Gd, Dy, Ho, Er or Tm.

11. The materials of claim 9 having the formula $R_2Ba_{4-q}La_qCu_7O_{15-\delta}$, wherein $-0.2<\delta<0.6$ and $0\leqq p+q<1$.

12. The material of claim 11, having the formula $Y_2Ba_{3.8}La_{0.2}Cu_7O_{15-\delta}$ wherein $-0.2<\delta<0.6$.

13. A process for preparing oxide materials which exhibit bulk superconductivity at [temperatures exceeding 85K] *a temperature of at least 88K* within the formula $$R_aB_bCu_cO_{15-\delta}$$

wherein:

$1.9<a<2.1$, $3.9<b<4.1$, $6.8<c\leqq 7.2$,

[$-0.2<\delta<0.6$] *$-0.2<\delta<0.1$,*

R is Y, La, Nd, Sm, Eu, Gd, Dy, Ho, Er, Tm or Yb, or any combination thereof, and B is Ba or Ba plus a minor amount of Sr or La or a combination thereof, comprising reacting precursor materials for between 1 and 300 hours at a temperature T (in units of °C.) and oxygen partial pressure $Po_2$ (in units of Pa) satisfying the equation $$1210-180L+21L^2<T<2320-581.5L+58.5L^2 \text{ where } L=\log_{10}Po_2.$$

14. A process for preparing oxide materials which exhibit bulk superconductivity at temperatures exceeding 85K within the formula $$R_{a-p}B_{b-q}A_{p+q}Cu_cO_{15-\delta}$$

wherein:

$1.9<a<2.1$, $3.9<b<4.1$, $6.8<c\leqq 7.2$,

[$0\leqq p+q<1$] *$0<p+q<1$, $p>0$, and,*

[$-0.2<\delta<0.6$] *$-0.2<\delta<0.1$,*

R is Y, La, Nd, Sm, Eu, Gd, Dy, Ho, Er, Tm or Yb, or any combination thereof,

B is Ba or Ba plus a minor amount of Sr, La, or a combination thereof,

A is Ca, Li, Na, K, Cs or Rb or any combination thereof or La or La in combination with any of Ca, Li, Na, K, Cs, and Rb comprising reacting precursor materials for between 1 and 300 hours at a temperature T (in units of °C.) and oxygen partial pressure $Po_2$ (in units of Pa) satisfying the equation $$1210-180L+21L^2<T<2320-581.5L+58.5\ L^2 \text{ where } L=\log_{10}Po_2.$$

15. The process according to claim 14 wherein [$0<p+q<1$ and] A is Ca.

16. The process according to [either one of claims 13 and 14] *claims 13, 14, or 29*, wherein $Po_2\leqq 10^6$ Pa.

17. The process according to [either of claims 13 and 14] *claims 13, 14, or 29*, wherein $Po_2$ is substantially $10^5$ Pa and 845° C.$\leqq T\leqq$870° C.

18. The process according to [either of claims 13 and 14] *claims 13, 14, or 29*, wherein the precursor materials are reacted together with an alkali flux, catalyst, or reaction rate enhancer comprising a nitrate, oxide, chloride, hydroxide or carbonate of any of Li, Na, K, Rb or Cs or any combination thereof.

19. The process according to [either of claims 13 and 14] *claims 13, 14, or 29*, wherein the precursor materials are reacted together with an alkali flux, catalyst, or reaction rate enhancer comprising a nitrate, oxide, chloride, hydroxide or carbonate of any of Li, Na, K, Rb or Cs or any combination thereof, and wherein the flux, catalyst or reaction rate enhancer is introduced as a mole fraction of the precursor materials between 0 and 1.0.

20. The process according to [either of claims 13 and 14] *claims 13, 14, or 29*, wherein the precursor materials are reacted together with an alkali flux, catalyst, or reaction rate enhancer comprising a nitrate, oxide, chloride, hydroxide or carbonate of any of Li, Na, K, Rb or Cs or any combination thereof, and wherein the flux, catalyst or reaction rate enhancer is introduced as a mole fraction of the precursor materials between 0.1 and 0.3.

21. A process according to [either of claims 13 and 14] *claims 13, 14, or 29*, wherein the oxygen partial pressure $Po_2$ is maintained by means of an electrochemical cell or whereby the effective $Po_2$ is maintained by controlling the chemical thermodynamic oxygen activity in the material by means of an electrochemical cell.

22. A process according to [either of claims 13 and 14] *claims 13, 14, or 29*, wherein periodically during the reaction the reactants are cooled and reground or milled and then recompacted.

23. A process according to [either of claims 13 and 14] *claims 13, 14, or 29*, including after forming the cation composition of the material altering or optimising the oxygen content of the material by oxygen diffusion in or out of the material.

24. A process according to [either of claims 13 and 14] *claim 23*, wherein the material is prepared to comprise residual substituted alkali or Ca in the material, or is prepared at a low synthesis temperature such that the material is of a small grain size, to an extent that said alteration or optimisation of the oxygen content is accelerated.

*25. Oxide materials which exhibit bulk superconductivity at temperatures exceeding 85K, within the formula*

$$R_aB_bCu_cO_{15-\delta}$$

*wherein:*

*$1.9<a<2.1$,*

$3.9<b<4.1$, $6.8<c\leqq 7.2$, $-0.2<\delta<0.0$,

*R is Y, La, Nd, Sm, Eu, Gd, Dy, Ho, Er, Tm or Yb, or any combination thereof, and*

*B is Ba or Ba plus a minor amount of Sr or La or a combination thereof.*

*26. The material of claim 25, wherein a=2, b=4, c=7 and having the formula*

$$R_2B_4Cu_7O_{15-\delta}.$$

*27. The material of claim 26, wherein δ is about 0 and R is Y, Nd, Sm, Eu, Gd, Dy, Ho, Er or Tm or any combination thereof.*

*28. The material of claim 26 wherein R consists essentially of Y or Er.*

*29. A process for preparing oxide materials which exhibit bulk superconductivity at temperatures exceeding 85K within the formula*

$$R_aB_bCu_cO_{15-\delta}$$

*wherein:*

$1.9<a<2.1$, $3.9<b<4.1$, $6.8<c\leqq 7.2$, $-0.2<\delta<0.6$,

*T is Y, La, Nd, Sm, Eu, Gd, Dy, Ho, Er, Tm or Yb, or any combination thereof, and*

*B is Ba or Ba plus a minor amount of Sr or La or a combination thereof,*

*comprising reacting precursor materials for between 1 and 300 hours at a temperature T (in units of °C.) and oxygen partial pressure $P_{02}$ (in units of Pa) satisfying the equation*

$$1210-180L+21L^2<T<2320-581.5L+58.5L^2$$

*where $L=\log_{10}P_{02}$ and $P_{02}\neq$ about 1 atmosphere.*

* * * * *